US007242228B2

United States Patent
Hölzle

(10) Patent No.: US 7,242,228 B2
(45) Date of Patent: Jul. 10, 2007

(54) METHOD AND DEVICE FOR GENERATING AN OUTPUT SIGNAL HAVING A PREDETERMINED PHASE SHIFT WITH RESPECT TO AN INPUT SIGNAL

(75) Inventor: Josef Hölzle, Bad Wörishofen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/227,987

(22) Filed: Sep. 15, 2005

(65) Prior Publication Data
US 2007/0057714 A1     Mar. 15, 2007

(51) Int. Cl.
*H03L 7/06* (2006.01)
(52) U.S. Cl. ...................................... 327/148; 327/231
(58) Field of Classification Search ........ 327/148–149, 327/153, 158, 161, 231–235, 237, 243–246; 331/17, 25, DIG. 2; 375/373–376; 326/93
See application file for complete search history.

(56) References Cited
U.S. PATENT DOCUMENTS 5,614,845 A * 3/1997 Masleid ........................ 326/93
6,330,330 B2 * 12/2001 Scott et al. .................. 379/413
6,356,131 B1 * 3/2002 Kuwano ...................... 327/255
6,744,281 B2 * 6/2004 Harrison ....................... 326/93

* cited by examiner

*Primary Examiner*—Linh My Nguyen
(74) *Attorney, Agent, or Firm*—Brinks Hofer Gilson & Lione

(57) ABSTRACT

An output signal is generated with a predetermined phase shift with respect to an input signal using a closed loop control. The input and output signal of the closed loop control are logically combined in accordance with first and second combinatory logic to generate first and second control signals. The first and second control signals selectively activate first and second current sources, respectively. The current supplied by the first current source charges a capacitance controlling the closed loop control, while the current supplied by the second current source discharges the capacitance. By selecting the types of the combinatory logics as well as the ratio of the currents supplied by the first and second current sources, the phase shift of the output signal with respect to the input signal can be variably adapted to individual requirements.

40 Claims, 11 Drawing Sheets

| MIN | CLK | PLUS | OUTPUT |
|---|---|---|---|
| 0 | 0 | 0 | — |
| 0 | 0 | 1 | phase_down |
| 0 | 1 | 0 | freq_up |
| 0 | 1 | 1 | phase_up |
| 1 | 0 | 0 | phase_up |
| 1 | 0 | 1 | freq_up |
| 1 | 1 | 0 | phase_down |
| 1 | 1 | 1 | — |

METHOD AND DEVICE FOR GENERATING AN OUTPUT SIGNAL HAVING A PREDETERMINED PHASE SHIFT WITH RESPECT TO AN INPUT SIGNAL

TECHNICAL FIELD

The present invention relates to a method and a device for generating an output signal which has a predetermined phase shift with respect to an input signal.

BACKGROUND

The generation of continuous signals, for example clock signals, having a predetermined phase shift with respect to a reference signal are used in many different applications. For example, shifting a clock signal by a constant phase, for example by 90°, is using during sampling of received data in a receiver component of a communication device to sample the received data in the center of a data eye. Furthermore, in so-called polyphase filters a phase shift of 90° is applied to signals irrespective of the frequency. Moreover, generating signals having a predetermined phase shift with respect to a reference signal is also used for the time-wise calibration of a plurality of signals or for the time-wise matching of signal sources. Devices for generating an output signal having a predetermined phase shift with respect to a reference signal can also be designed for using so-called early-late phase detectors, for example so-called Hogge-detectors.

As regards the above-mentioned applications, several solutions are known from the prior art. Conventionally, delay elements are used for generating an output signal having a predetermined phase shift with respect to an input signal. These delay elements may comprise a plurality of gates connected in series, which is the simplest embodiment of such a delay device.

FIG. 10 shows a device or circuit arrangement which is often used for shifting a clock signal by 90°. According to FIG. 10, chip-internal passive filters comprising an RC network with resistors and capacitances. This passive RC network is a frequency selective network for generating an output signal OUT2 having a phase shift of ±90° with respect to an input signal IN. In addition, the circuit arrangement of FIG. 10 generates an output signal OUT1 having no phase shift with respect to the input signal IN. In order to obtain an output signal which is the inverted version of the input signal IN, the same RC network would have to be used one more time to shift the output signal OUT2 by further 90°. The problem of the solution shown in FIG. 10 is that the required space is relatively high and the electric components have tolerances which are problematic in many applications, especially in applications which require a very precise phase shift of the output signal with respect to the input signal.

Other conventional devices for generating an output signal having a predetermined phase shift with respect to an input signal are based on the principle of a so-called delay locked loop (DLL).

FIG. 11 shows an example for such a conventional DLL-based device which, in particular, can be used for the time-wise calibration of a plurality of signals. According to FIG. 11, the DLL comprises a plurality of identical voltage controlled delay elements 41 connected in series and a phase detector 42. The input signal of the first delay element 41 and of the phase detector 42 is the output signal of a demultiplexer 40 which receives a plurality of input signals IN1–IN3 which are to be calibrated. Furthermore, the demultiplexer 40 is controlled by a selection signal SEL for selecting one of the input signals IN1–IN3 as an input signal for the DLL. The phase detector 42 compares the phase of the output signal of the last delay element with the phase of the input signal of the DLL, that is to say the output signal of the demultiplexer 40, which serves as a reference signal for the DLL. The output signals A–C of individual delay element 41 are supplied to a multiplexer 43 which is also controlled by the selection signal SEL. Depending on the phase comparison of the phase detector 42 the delay time of the individual delay elements 41 is controlled by the phase detector 42. The time shift between signals A and B is for example T1, while the time shift between signals B and C is for example T2≠T1. After the calibration of the input signals IN1–IN3 has been completed, for each input signal IN1–IN3 the appropriate delay element 41 of the chain of delay elements is determined, whose output signal is supplied to the multiplexer 43. One problem of the circuit arrangement shown in FIG. 11 is the relatively large number of circuit components and the required space. Even more important, however, is that the time-wise calibration can only be as precise as the delay time of one individual delay element 41, which is often insufficient for applications requiring a very precise calibration of a plurality of input signals.

In various applications phase detectors are used to detect a phase error between a reference signal and an output signal. For example, it is the function of a clock and data recovery circuit of a communication device to create a properly aligned clock to an incoming data pattern, and to retime the input data according to that clock. This is accomplished by using a PLL, and a phase error signal is produced and used to properly set the phase and frequency of a voltage controlled oscillator (VCO) through closed loop feedback. The generation of the phase error signal is generally performed by phase detector designs, which are classified as either linear and bang-bang approaches. Linear phase detectors, for which the Hogge-detector is a common implementation, create a continuous error signal that leads to linear behaviour in the tracking characteristics of the PLL, while bang-bang detectors generate a quantized phase error signal, which leads to non-linear tracking characteristics.

An example for a conventional Hogge phase detector design is shown in FIG. 12. The circuit of FIG. 12 comprises a first register or flip-flop 50 connected in series with a second register or flip-flop 51 acting as a latch. Both flip-flops 50, 51 are master-slave flip-flops. The input data is supplied to the first flip-flop 50. The data signal DATA is combined with the output signal of the first flip-flop 50 by a first XOR gate 53 to create an UP phase error signal, while the output signal of the first flip-flop 50 and the output signal of the second flip-flop 51 are combined by a second XOR gate 54 to create a DOWN phase error signal. Both flip-flops 50, 51 are inversely operated by a clock signal CLK using an inverter 52. The output signal of the second flip-flop 51 corresponds to the retimed data signal DATA', and the phase error signals UP/DOWN indicate whether the clock signal CLK lags or leads the data signal DATA acting as a reference signal so as to be able to properly align the phase shift of the clock signal CLK with respect to the incoming data signal DATA.

The Hogge phase detector shown in FIG. 12 is an easy to implement phase detector design, but it works with fixed, that is non-variable, sampling times. Consequently, the sampling times cannot be adapted to the respective task. In addition, the Hogge phase detector design requires a critical alignment of the run time of the first flip-flop 50 shown in FIG. 12.

SUMMARY

A device and method are provided for generating an output signal having a predetermined phase shift with respect to an input signal. The device and method allow easy generation, and with reduced complexity, of an output signal having a predetermined phase shift with respect to an input signal, whereby the phase shift of the output signal can be adjusted variably at high precision using a continuous closed loop control.

By way of introduction only, a method and a corresponding device are provided in which an output signal is generated in dependence upon an input signal using a closed loop control. The input signal is logically combined with the output signal of the closed loop control using first combinatory logic to generate a first control signal and using second combinatory logic to generate a second control signal. A first electrical energy source is activated in accordance with the first control signal, while a second electrical energy source is activated in accordance with the second control signal. The closed loop control is operated with electrical energy corresponding to a combination of the energy supplied by the first electrical energy source and the energy supplied by the second electrical energy source so as to generate the output signal having a predetermined phase shift with respect to the input signal.

According to another embodiment, the first and second electrical energy sources are current sources which generate a first current and a second current, respectively, at respective times depending on the logical levels of the first control signal and the second control signal, respectively. The difference current between the currents supplied by the current sources is used for charging and decharging, respectively, a capacitance controlling the closed loop control circuit. The closed loop control circuit may be a delay locked loop (DLL) or a phase locked loop (PLL). When using a DLL, the capacitance controls at least one delay element of the DLL.

The individual energy sources (e.g. current sources) supply currents in accordance with a predefined ratio which depends on the task to be fulfilled, that is, the phase shift of the output signal. For example, if the first combinatory logic is a logical OR gate and the second combinatory logic is a logical AND gate and both current sources supply currents in accordance with the ratio 1/3, the output signal has a phase shift of 90° with respect to the input signal, while the output signal has a phase shift of 60° with respect to the input signal if the ratio of the currents supplied by the current sources is 1/2.

As can be seen, the phase shift of the output signal can be easily varied and adjusted by adapting the ratio of the electrical energy sources accordingly.

To avoid a possible ambiguity with respect to the phase position, an additional signal can be evaluated, this signal being delayed with respect to the input signal. The additional signal can be supplied to the first combinatory logic and/or the second combinatory logic.

The foregoing summary has been provided only by way of introduction. Nothing in this section should be taken as a limitation on the following claims, which define the scope of the invention.

BRIEF DESCRIPTION OF THE FIGURES

The application will be described below in greater detail on the basis of preferred embodiments and with reference to the accompanying drawings, in which:

FIG. 2A shows an implementation of the embodiment of FIG. 1, while FIG. 5A shows a variant of the implementation shown in FIG. 2, which avoids this ambiguity, while

DETAILED DESCRIPTION

Figure 1:
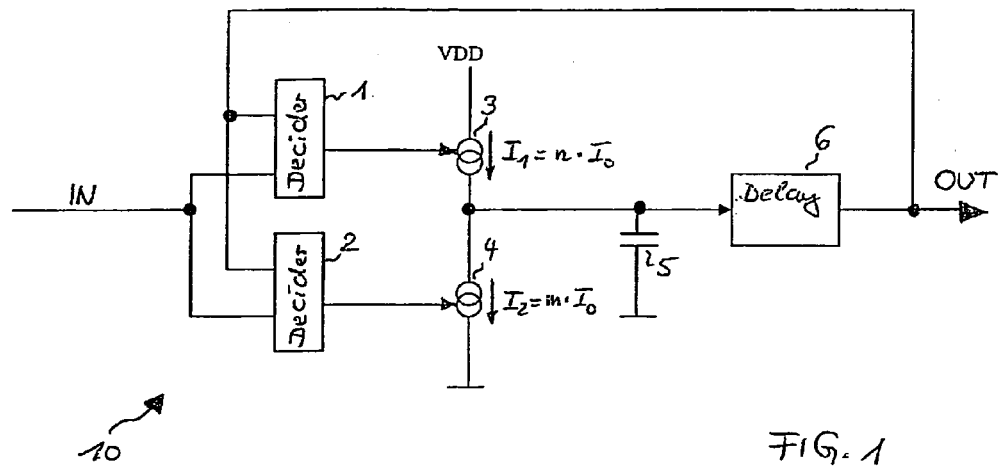
FIG. 1 shows a device for generating an output signal having a predetermined phase shift with respect to an input signal in accordance with an embodiment of the present invention.

FIG. 1 shows a device for generating an output signal OUT having a predetermined phase shift with respect to an input signal IN.

The device 10 shown in FIG. 1 comprises a first decider 1 which logically combines the input signal IN with the output signal OUT to generate a control signal which is used to selectively activate an energy source 3, which in the present case is a current source. Furthermore, the device 10 comprises a second decider 2 which logically combines the output signal OUT and the input signal IN in accordance with other combinatory logic to generate a second control signal which is used to selectively activate a second energy source/current source 4. As shown in FIG. 1, the current sources 3, 4 are connected between a positive supply voltage VDD and ground potential. The circuit node between both current sources 3, 4 is coupled to a capacitance 5 controlling at least one delay element 6 of the closed loop control circuit, which may be a delay locked loop circuit (DLL) or a phase locked loop circuit (PLL). The structure of such a DLL/PLL is known to one of ordinary skill in the art and, consequently, will not be described in detail here. The capacitance 5 can, for example, be a capacitance incorporated into a loop filter of the DLL/PLL.

As can be seen from FIG. 1, the difference current between the current $I_1$ of the first current source 3 and the current $I_2$ of the second current source is used for charging/discharging the capacitance 5 and consequently controls the operation of the DLL/PLL. Depending on the desired task of the device 10, that is the desired phase shift of the output signal OUT with respect to the input signal IN, the ratio between the currents $I_1$ and $I_2$ is adjusted accordingly. As shown in FIG. 1, $I_1 = n \cdot I_0$ and $I_2 = m \cdot I_0$ with n, m=1, 2, ... and $I_0$ being a predetermined unitary current.

In principle, the deciders 1, 2, which are preferably realized in the form of logical gates, can in principle be of any nature, and the ratio between the current sources 3, 4 is adapted to the nature of the deciders 1, 2 accordingly. The deciders 1, 2 are designed such that they can logically combine the output signal OUT and the input signal IN depending on the desired phase shift.

Figure 2B:
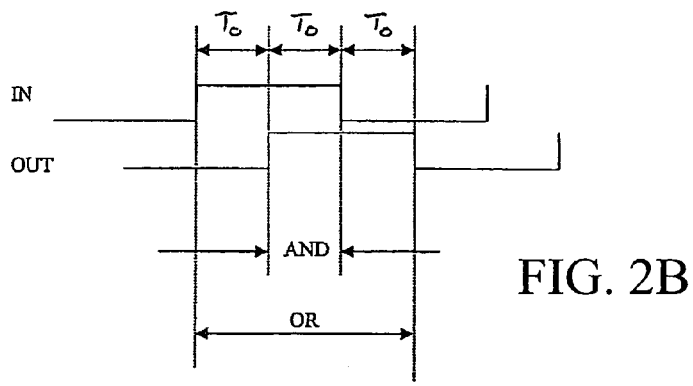
FIG. 2B shows a time chart for FIG. 2A, FIG. 3A and FIG. 3B as well as FIG. 4 show time charts for explaining a possible ambiguity regarding the phase position of an output signal with respect to an input signal in FIG. 1 and FIG. 2.
Figure 2A:
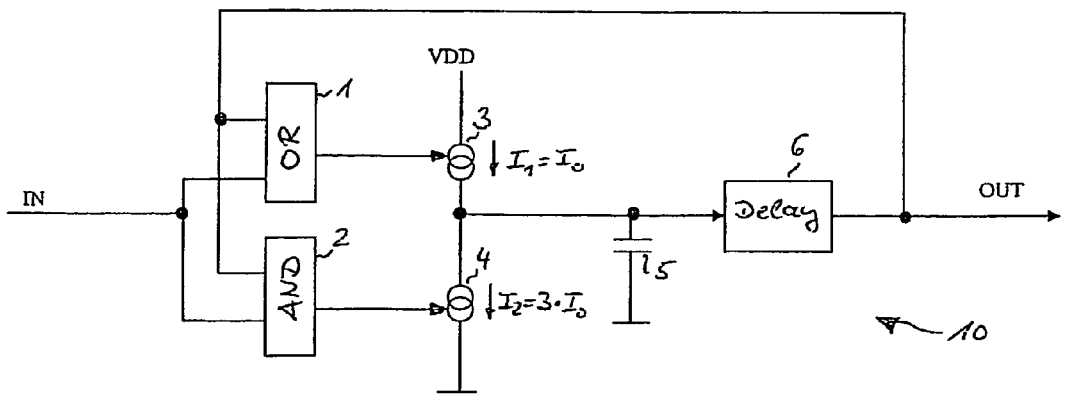

FIG. 2A shows a possible implementation of the device depicted in FIG. 1.

According to FIG. 2A, the first decider 1 is realized by a logical OR gate, while the second decider 2 is realized by a logical AND gate. The output of the OR gate 1 controls the first current source 3, while the output of the AND gate 2 controls the second current source 4 with $I_1=I_0$ and $I_2=3 \cdot I_0$, which means $I_1/I_2=1/3$. In FIG. 2, "AND" indicates the time period during which the output of the AND gate 2 has a high logical level activating the second current source 4, while "OR" indicates the time period during which the output of the OR gate 1 has a high logical level activating the first current source 3.

As depicted in the upper portion of FIG. 2A, if the ratio between the currents $I_1$ and $I_2$ is 1/3, the phase shift between the output signal OUT and the input signal IN is 90° if the DLL is in its locked state.

It should be noted that the combinatory logics of both deciders 1, 2 and the current ratios $I_1/I_2$ are chosen such that the current/time products of both current sources 3, 4 are identical, which means $I_1 \cdot T_1 = I_2 \cdot T_2$ with $T_1$ being that time period during which the first current source 3 is activated, while $T_2$ is that time period during which the second current source 4 is activated.

As depicted in FIG. 2B, if the ratio between the currents $I_1$ and $I_2$ is 1/3, the phase shift between the output signal OUT and the input signal IN is 90° if the DLL is in its locked state.

The phase shift of the output signal OUT with respect to the input signal IN can be easily adjusted by adapting the ratio of the current sources 3, 4 accordingly. For example, if $I_1/I_2=1/2$, the phase shift is 60°.

Figure 3A:
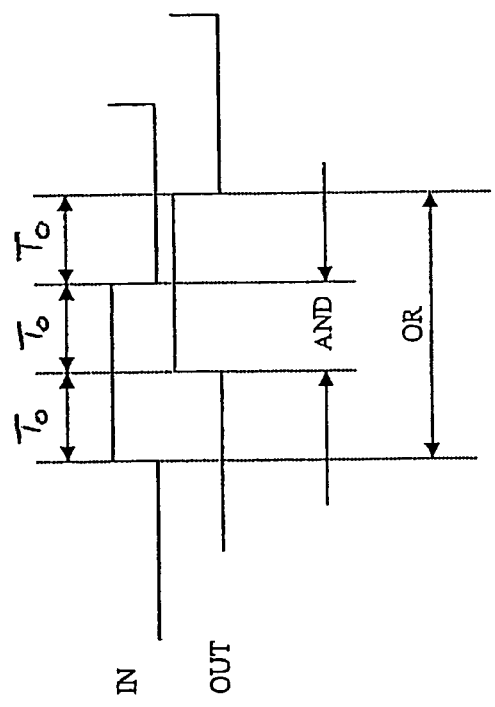
Figure 3B:
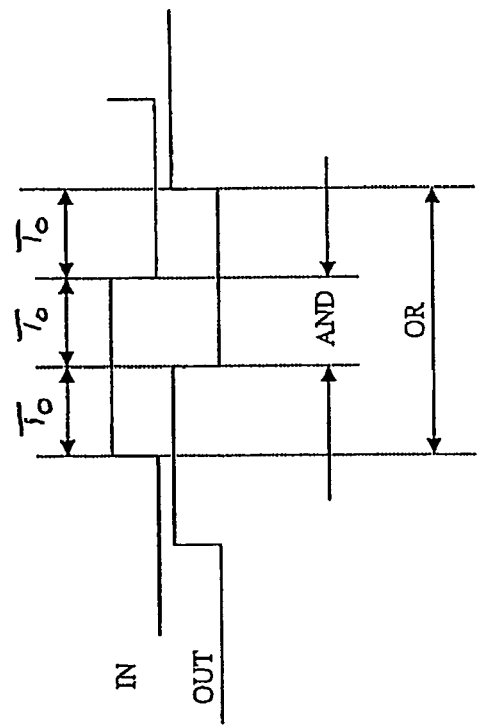

As shown in FIG. 3A and FIG. 3B, in the circuit arrangement of FIG. 2 two stable states of the DLL can occur. Both FIG. 3A and FIG. 3B relate to a phase shift of 90° between the input signal IN and the output signal OUT. However, in FIG. 3A the output signal OUT lags the input signal IN, while in FIG. 3B the output signal OUT leads the input signal IN.

Figure 4:
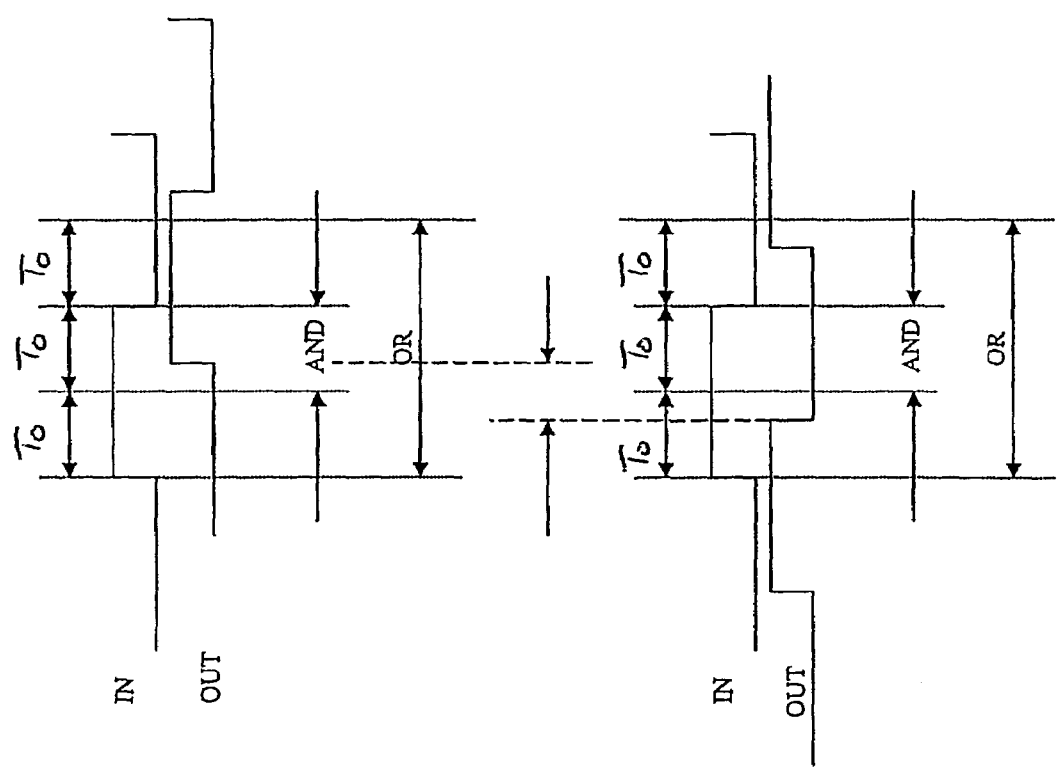

As indicated in FIG. 4, which shows intermediate positions relating to the phase position of the output signal OUT with respect to the input signal IN during the unlocked state of the DLL, the circuit arrangement of FIG. 2 generates information for centering the pulse of the output signal OUT with respect to a respective pulse of the input signal IN so that finally the circuit arrangement assumes one of the two stable states shown in FIG. 3A and FIG. 3B, respectively.

However, in order to avoid such an ambiguity regarding the phase position between the output signal OUT and the input signal IN, an additional signal derived from the input signal IN may be evaluated. A corresponding variant of the embodiment shown in FIG. 2 is depicted in FIG. 5A.

Figure 5B:
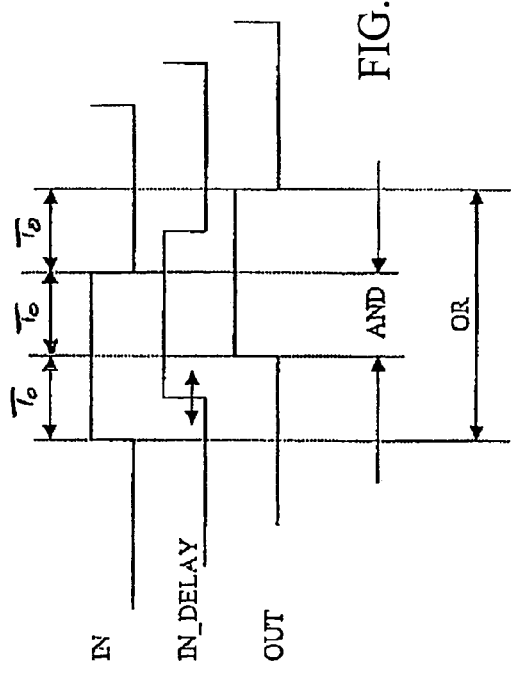
FIG. 5B shows a time chart for FIG. 5A.
Figure 5A:
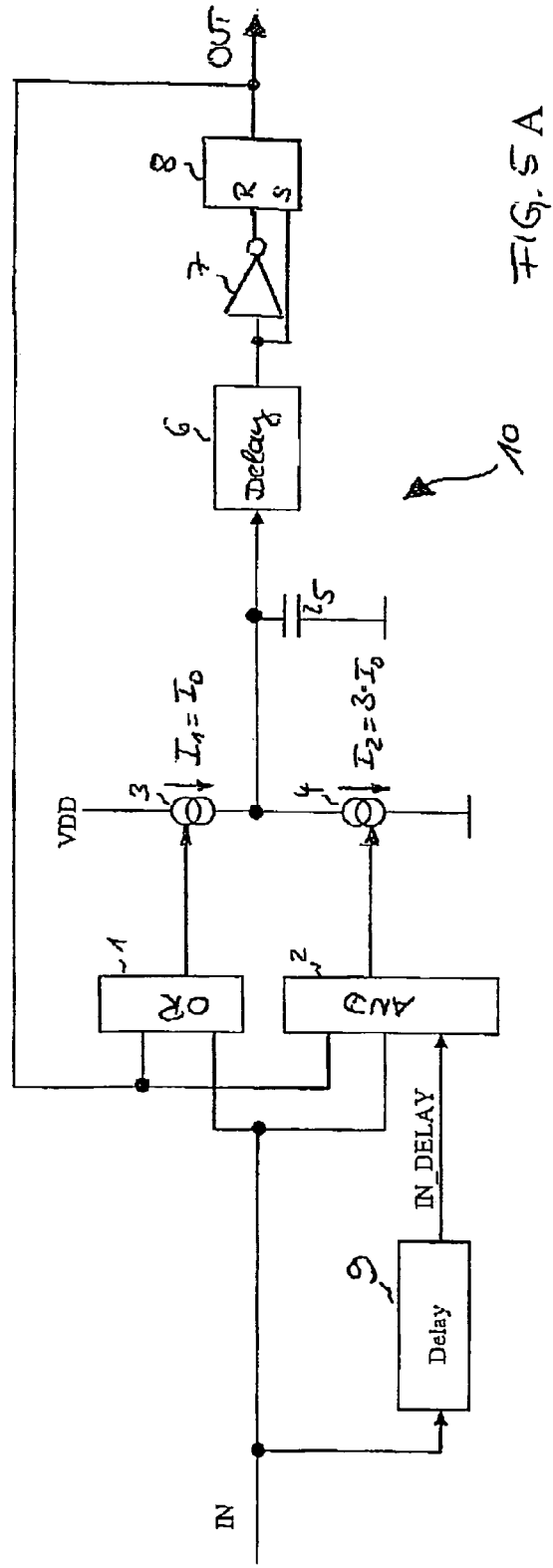

The circuit arrangement of FIG. 5A differs from the circuit arrangement of FIG. 2A in that an additional signal IN_DELAY is evaluated, whereby this signal IN_DELAY is a delayed version of the input signal IN and is generated by means of a delay element 9. In the embodiment of FIG. 5A, this additional signal IN_DELAY is supplied to the second decider, that is the AND gate 2. However, depending on the respective application and the combinatory logics chosen for the first and second deciders 1, 2, it is also possible that the signal IN_DELAY is supplied to the first decider, that is the OR gate 1.

As can be taken from the time chart in FIG. 5B, the delayed signal IN_DELAY helps to clearly define the phase position between the output signal OUT and the input signal IN, and in the embodiment of FIG. 5A, the delayed signal IN_DELAY avoids that the circuit arrangement and its DLL assumes the stable state shown in FIG. 3B. Consequently, in its locked condition, the circuit arrangement 10 assumes the stable state shown in FIG. 3A, as also indicated in the time chart of FIG. 5A.

The embodiment of FIG. 5A differs from the embodiment of FIG. 2A also in that means for level adaptation are coupled between the output of the delay element 6 and the output terminal of the circuit arrangement 10. According to FIG. 5A, these means for level adaptation comprise an inverter 7 and an RS flip-flop 8 being interconnected as shown in FIG. 5A.

The time delay effected by the delay element 9 is chosen such that the phase shift between the input signal IN and the additional signal IN_DELAY is smaller than the desired phase shift between the output signal OUT and the input signal IN, as shown in FIG. 5A.

Moreover, it should be noted that the circuit arrangements discussed before with respect to FIG. 1–FIG. 5 are effective only with respect to the high level portion of the input signal IN so that the initial duty cycle of the input signal IN remains unchanged. This may differ in other embodiments, as desired.

Figure 6:
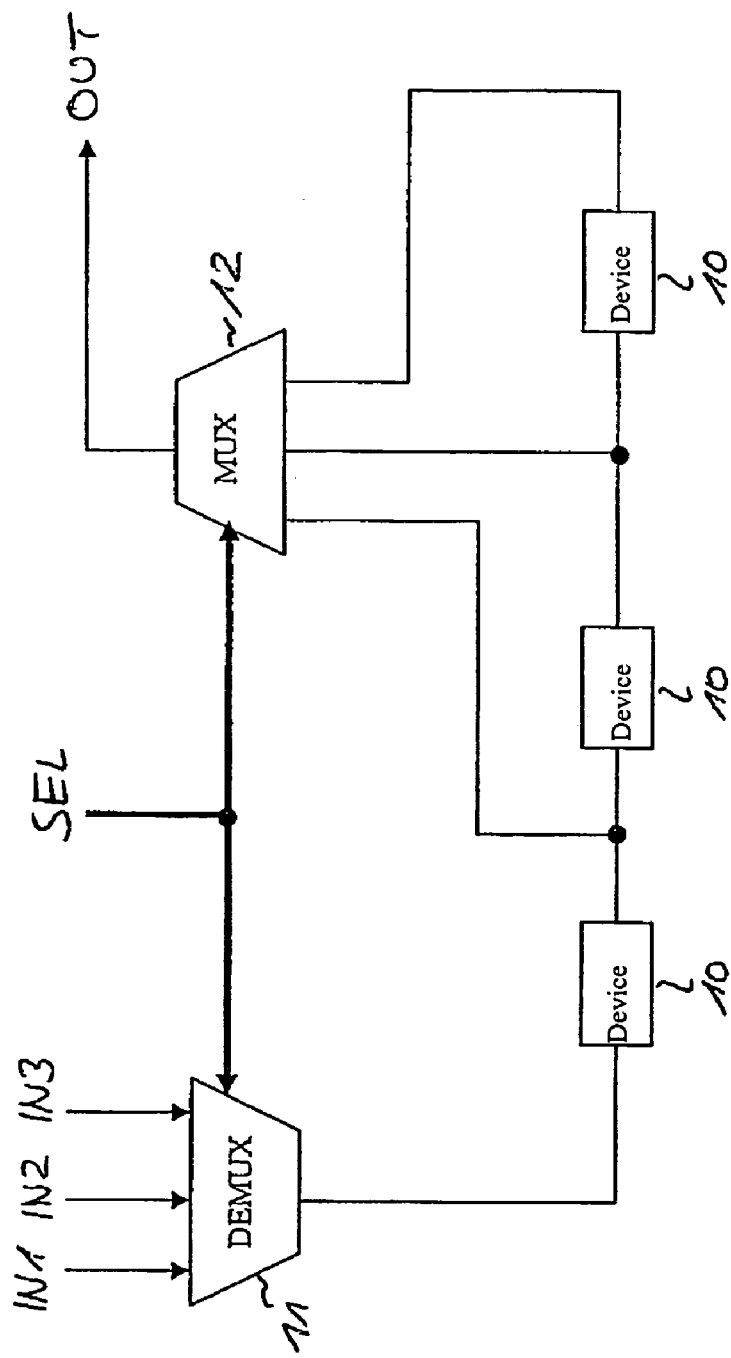
FIG. 6 shows a circuit arrangement for the calibration of a plurality of signals using the principle of the present invention.
Figure 11:
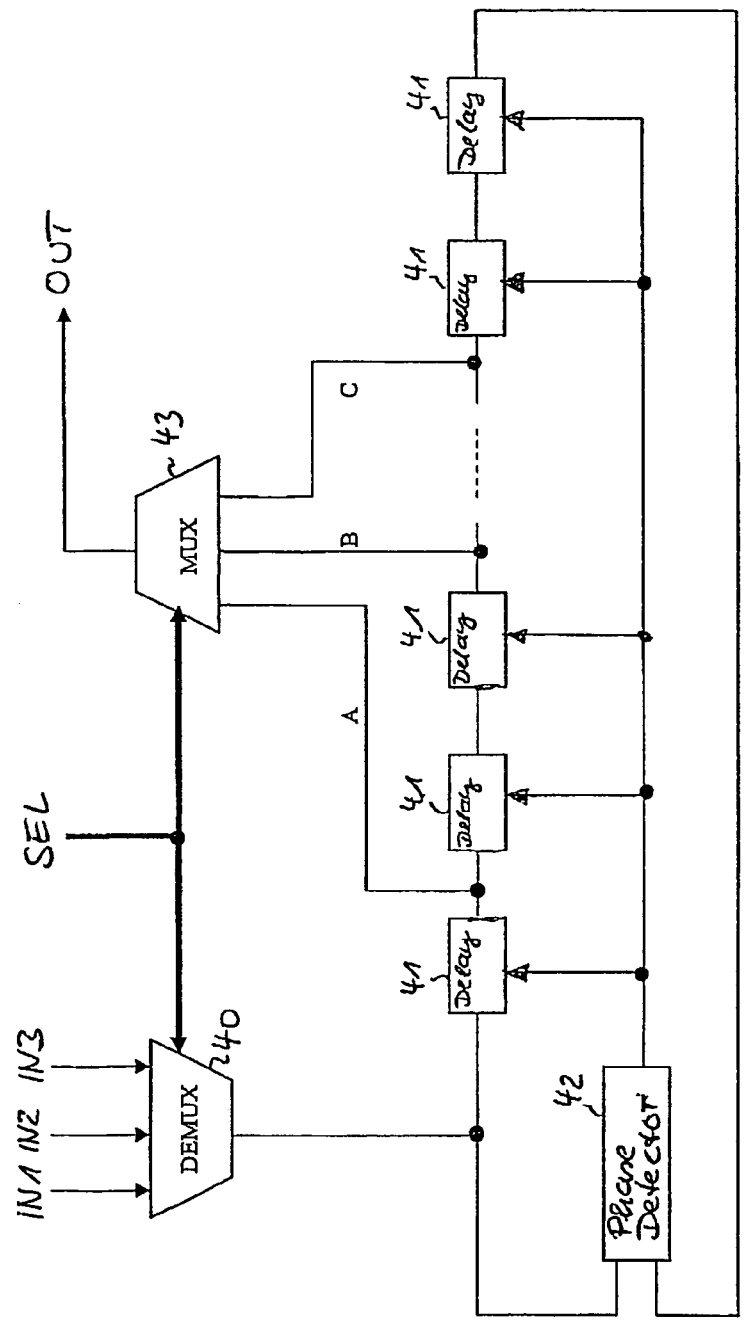
FIG. 11 shows a circuit arrangement for the calibration of a plurality of signals using a chain of identical delay elements according to the prior art.

FIG. 6 shows an example for the usage of the present invention for the calibration of a plurality of input signals, for example three input signals IN1–IN3, similar to the circuit arrangement according to the prior art as shown in FIG. 11.

In FIG. 6, a demultiplexer 11 receiving the input signals IN1–IN3 to be calibrated and a multiplexer 12 outputting the output signal OUT are provided, the demultiplexer 11 and the multiplexer 12 being controlled by a selection signal SEL similar to FIG. 11. However, contrary to FIG. 11, a plurality of closed loop controls or circuit arrangements 10 shown in FIG. 1–FIG. 5 are connected in series, the output signals of the individual circuit arrangements 10 being supplied to the input terminals of the multiplexer 12. Consequently, the result is the desired delay and the desired phase shift of the individual signal without any granularity problems.

Figure 7A:
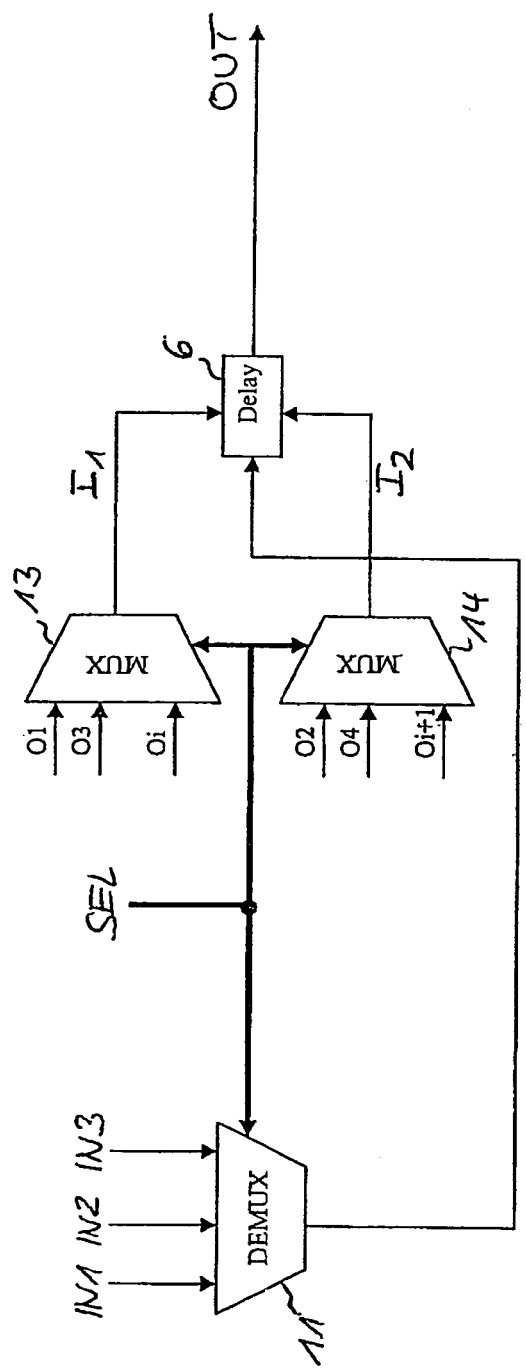
FIGS. 7A and 7B show another circuit configuration for the calibration of a plurality of signals.
Figure 7B:
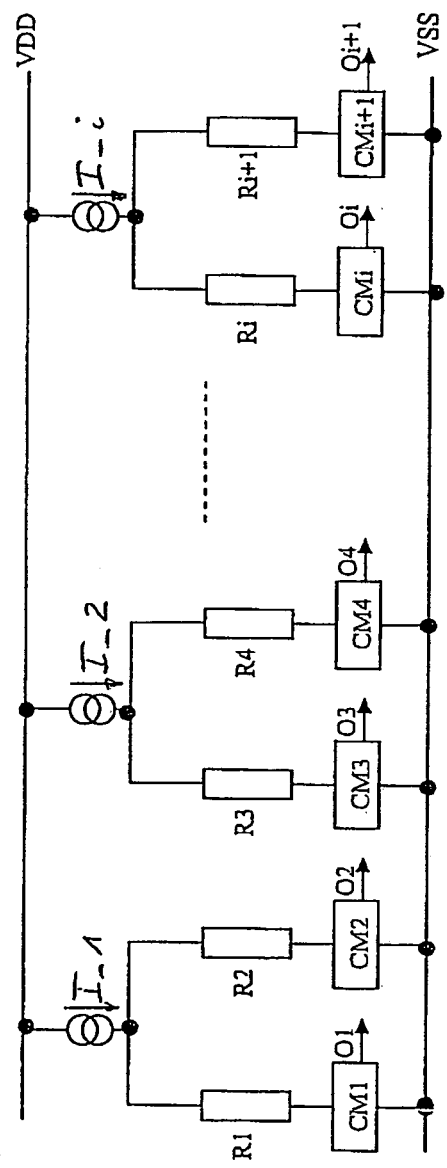

FIGS. 7A and 7B show a different approach for the calibration of the input signals IN1–IN3. The advantage of this approach over the solution of FIG. 6 is that slower control signals are multiplexed instead of faster data signals.

FIG. 7A shows a possible implementation of a circuit arrangement for the calibration of a plurality of input signals IN1–IN3 similar to the prior art discussed above with respect to FIG. 11. Similar to FIG. 11, a demultiplexer 11 controlled by a selection signal SEL is used, which receives the plurality of input signal IN1–IN3. The selection signal SEL also controls two multiplexers 13, 14 which receive as input signals O1, O3, . . . Oi and O2, O4, . . . Oi+1 currents which are provided by a current mirror circuit arrangement shown in FIG. 7B.

The current mirror circuit arrangement of FIG. 7B comprises a plurality of current sources I_1 . . . I_i, each connected to a parallel connection of a first resistor R1, R3, . . . Ri and a first current mirror CM1, CM3, . . . CMi and a second resistor R2, R4, . . . Ri+1 and a second current mirror CM2, CM 4, . . . CMi+1. Each current mirror CMi outputs the respective current Oi, the output currents being adjustable by an appropriate choice of the resistances of the resistors. The currents provided by the current sources I_1 ... I_i, which in FIG. 7B are coupled between voltage potentials VDD and VSS, provide the relative values between the individual output currents.

The multiplexer 13 generates a charge current $I_1$, while the multiplexer 14 generates a discharge current $I_2$ depending on the respective currents supplied to its input terminals. The charge and discharge currents $I_1$ and $I_2$ can be used for charging and discharging, respectively, the capacitance controlling a delay element 6 of a DLL similar to the currents $I_1$ and $I_2$ of FIG. 2A. The calibration between the individual input signals IN1–IN3 is performed by multiplexing operation by the multiplexers 13, 14 with respect to the controlling currents O1, O3, ... Oi and O2, O4, ... Oi+1, respectively.

Thus, FIG. 7A and FIG. 7B show how different currents $I_1$ and $I_2$ can be used for charging and discharging the capacitance controlling a delay element by appropriately choosing the resistances of the individual resistors.

Figure 12:
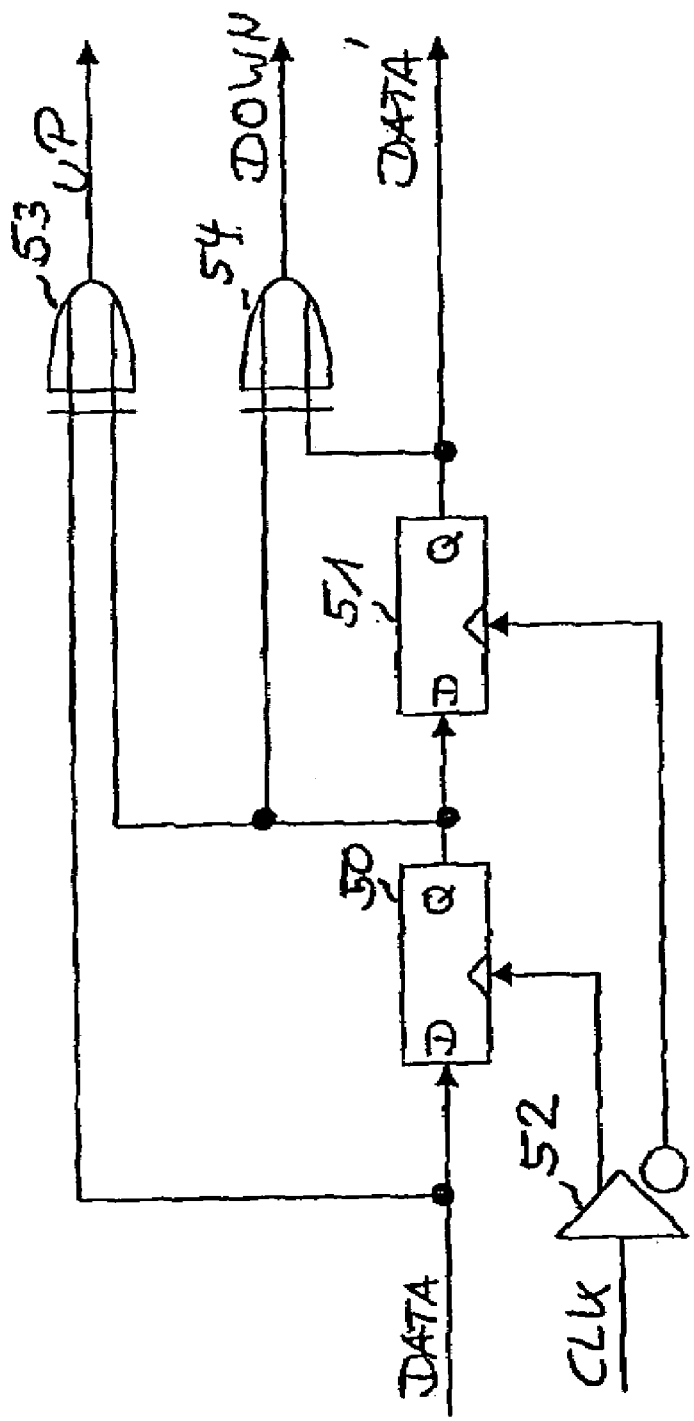
FIG. 12 shows a conventional Hogge phase detector.

The present invention can also be used as a phase detector similar to the Hogge phase detector shown in FIG. 12, since the present invention allows precise alignment of the phase shift of a clock signal CLK with respect to a data signal DATA.

Figures 8A, 8B:
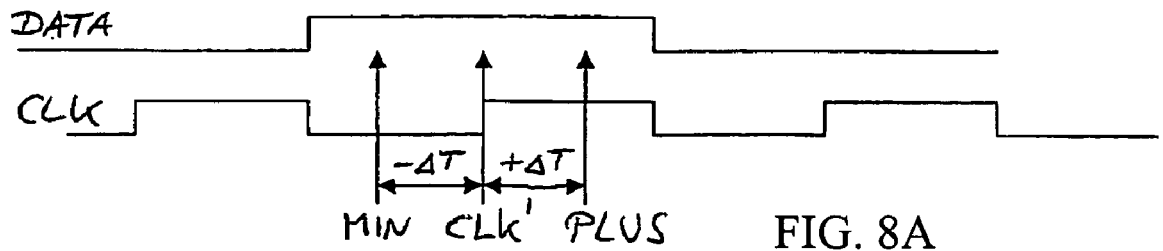
FIGS. 8A and 8B show a time chart and a truth table, respectively, for explaining the usage of the present invention for a phase detector.

As indicated in FIG. 8A, if the clock signal is sampled at three different positions, namely at a (rising) edge CLK' of the clock signal and shifted with respect to the edge of the clock signal by $\pm\Delta T$ at MIN and PLUS, the present invention allows evaluation of the sample values of the signals MIN and PLUS, which are shifted with respect to the edge of the clock signal CLK by the adjustable amount $-\Delta T$ and $+\Delta T$, respectively, and the sample value at CLK'. The truth table depicted in FIG. 8B shows the output of the phase detector using the principle of the present invention depending on the momentary values of the signals MIN and PLUS as well as the momentary value of CLK'. The output of the phase detector indicates whether the phase of the clock signal CLK is to be reduced ("phase_down") or increased ("phase_up"), or whether the frequency of the clock signal CLK is to be increased ("freq_up").

The phase detector shown permits the sampling times for creating the signals MIN and PLUS as well as for sampling the clock signal CLK to be variable and adaptable to the individual task. As can be taken from the truth table shown in FIG. 8B, the truth table also provides an indication if the clock frequency is too low. In addition, the phase detector of the present invention does not require the critical time alignment of the run time of the first flip-flop 50 shown in FIG. 12 of the conventional Hogge phase detector.

By using the arrangement discussed above with respect to FIG. 1–FIG. 5, for example, the phase positions of the sampling signals MIN, CLK', PLUS can be adjusted at high precision by adjusting $\pm\Delta T$ accordingly.

Figure 9:
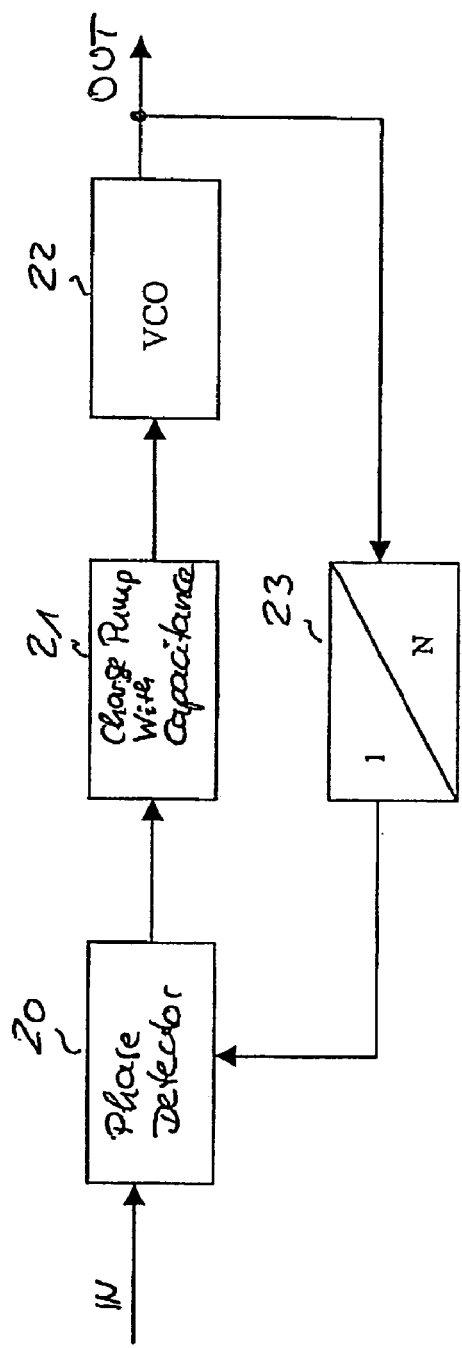
FIG. 9 shows an embodiment of the present invention using a phase locked loop (PLL)
Figure 10:
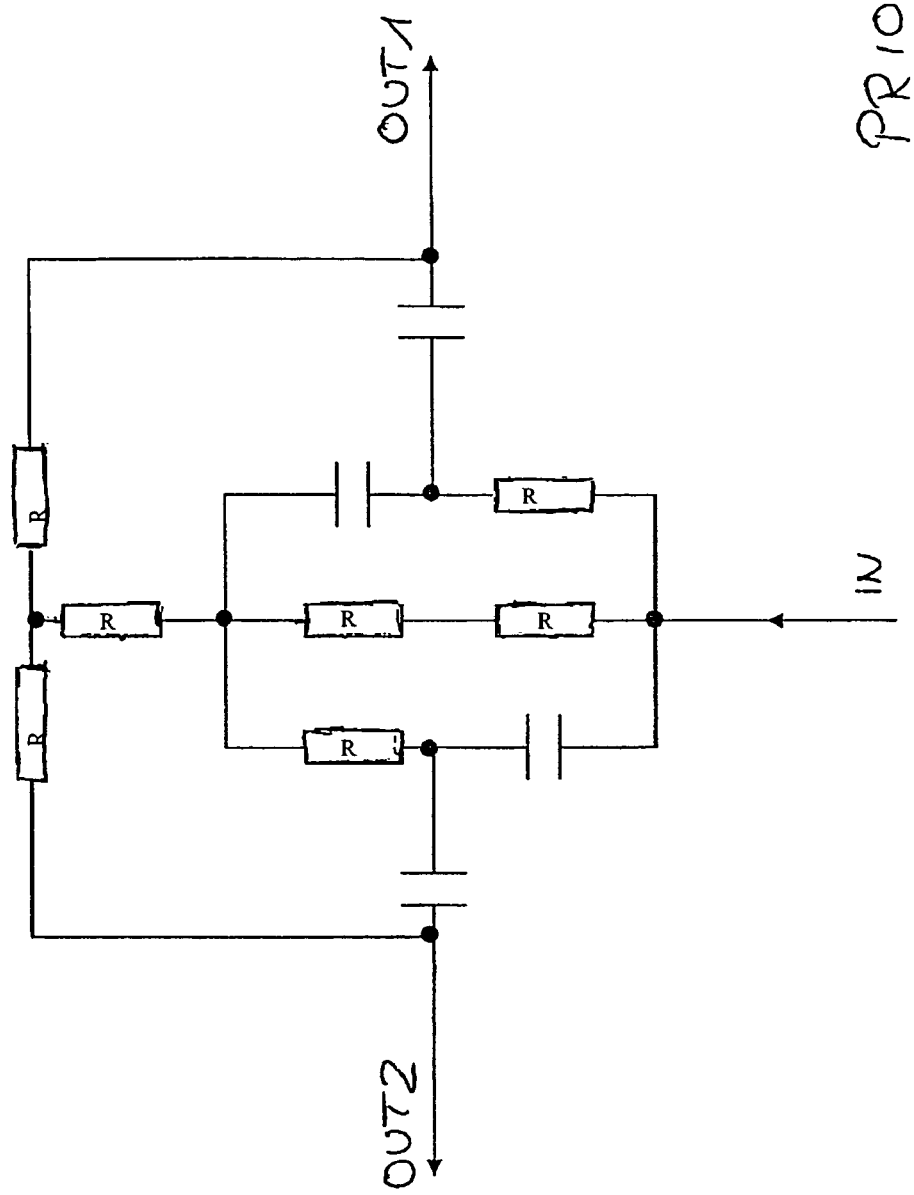
FIG. 10 shows a passive RC network for generating a phase shift of 90° according to the prior art.

As already discussed before with respect to FIG. 1, the present invention can be applied both to a DLL and a PLL. FIG. 9 shows a possible application of the present invention in a PLL circuit arrangement.

The PLL circuit arrangement shown in FIG. 9 comprises, similar to a conventional PLL, a phase detector 20, a charge pump 21, a voltage controlled oscillator (VCO) 22 and a frequency divider 23 located in the feedback path of the PLL. The output signal OUT of the voltage controlled oscillator 22 is supplied via the feedback path including the frequency divider 23 to the phase detector 20, and the phase detector 20 detects a phase difference between the input signal IN and the feedback signal. Depending on the phase difference as detected by the phase detector 20, the phase detector 20 generates a control signal for the voltage controlled oscillator 22, which is supplied to the voltage controlled oscillator 22 via the charge pump 21.

The present invention can be used to realize the function of the phase detector 20. If the deciders 1, 2 and current sources 3, 4 of FIG. 1 are integrated into the phase detector 20, an additional phase shift of the output signal OUT with respect to the input signal IN can be achieved by an appropriate choice of the current ratio $I_1/I_2$ and the logical operations of both deciders 1, 2, this additional phase shift in particular being independent from the division factor N of the frequency divider 23 located in the feedback path of the PLL. The capacitance 5 shown in FIG. 1 may be realized by a capacitance of the charge pump 21 of the PLL, the charge pump being part of a loop filter of the PLL.

Similar problems occur if the shortest possible hold time and a corresponding set-up time (which is longer than in the preceding case) are specified in each case for the circuit paths. This is referred to as the "best case".

As described, the phase shift of the output signal with respect to the input signal can be easily and variably adjusted at high precision. The circuit arrangement effects automatic alignment due to the closed loop control so that no granularity problems arise. In order to adjust the phase shift of the output signal properly, the relative values of the energy sources (current sources) are used. The universal circuit design disclosed herein can be used for a plurality of different applications.

For example, various circuit designs can be used for shifting the phase of a clock signal (for example for sampling an incoming data signal by means of a clock and data recovery circuit), for shifting signals in polyphase filters, for the time-wise calibration of a plurality of signals, for shifting a pulse by a predetermined delay time, for prolonging or shortening a pulse, for centering a pulse, for clock adaptations in synchronous systems, or for phase detector applications etc. As a matter of course, however, the present invention is not limited to these applications but can be used for any application where the generation of an output signal with a highly precise phase shift with respect to an input signal is required.

As discussed, there exist numerous ways to implement a device for generating an output signal having a predetermined phase shift with respect to an input signal according to the present invention. It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A method for generating an output signal having a predetermined phase shift with respect to an input signal using closed loop control, the method comprising:
    logically combining the input signal and the output signal of the closed loop control in accordance with first combinatory logic to generate a first control signal;
    logically combining the input signal and the output signal of the closed loop control in accordance with second combinatory logic to generate a second control signal;
    activating a first electrical energy source in accordance with the first control signal;
    activating a second electrical energy source in accordance with the second control signal;

operating the closed loop control with electrical energy corresponding to a combination of energy supplied by the first and second electrical energy sources to generate the output signal;

wherein the first electrical energy source is a first current source and the second electrical energy source is a second current source;

the first combinatory logic generates the first control signal with a first logical level to activate the first current source and with a second logical level to deactivate the first current source;

the second combinatory logic generates the second control signal with a first logical level to activate the second current source and with a second logical level to deactivate the second current source; and the first and second combinatory logic and the first and second current sources are selected such that $I_1/I_2=n/m$ and $T_1T_2=m/n$ with n, m being positive numbers and $I_1$ being current generated by the first current source, $I_2$ being current generated by the second current source, $T_1$ being a time interval during which the first combinatory logic generates the first control signal with the first logical level, and $T_2$ being a time period during which the second combinatory logic generates the second control signal with the first logical level.

2. The method according to claim 1, wherein a capacitance controlling the closed loop control is charged by the energy supplied by the first electrical energy source and discharged by the energy supplied by the second electrical energy source to generate the output signal by the closed loop control.

3. The method according to claim 1 wherein the first and second control signals activate the first and second electrical energy sources if the first and second control signals have a first logical level, while the first and second control signals deactivate the first and second electrical energy sources respectively If the first and second control signals have a second logical level.

4. The method according to claim 1, wherein current supplied by the first current source is used to charge a capacitance controlling the closed loop control while current generated by the second current source is used to discharge the capacitance of the dosed loop control.

5. The method according to claim 1, wherein the closed loop control is operated with a difference current between current generated by the first current source and current generated by the second current source to generate the output signal.

6. The method according to claim 1, wherein the first combinatory logic is an OR logic gate, and the second combinatory logic is an AND logic gate, and n=1 and m=3 to generate the output signal with a phase shift of 90° with respect to the input signal.

7. The method according to claim 1, wherein the first combinatory logic is an OR logic gate, and the second combinatory logic is an AND logic gate, and n=1 and m=2 to generate the output signal with a phase offset of 60° with respect to the input signal.

8. The method according to claim 1, wherein the first combinatory logic is an OR logic gate, and the second combinatory logic is an AND logic gate.

9. The method according to claim 1, wherein the ratio between the energy supplied by the first electrical energy source and the energy supplied by the second electrical energy source is varied to adjust a phase offset of the output signal with respect to the input signal.

10. The method according to claim 1, wherein an additional signal delayed with respect to the input signal is ted to at least one of the first combinatory logic or the second combinatory logic.

11. The method according to claim 1, wherein a level adaptation is performed at an output of the closed loop control, the level adaptation outputting the output signal.

12. A method for generating an output signal having a predetermined phase shift with respect to an input signal using closed loop control, the method comprising:

logically combining the input signal and the output signal of the closed loop control in accordance with first combinatory logic to generate a first control signal;

logically combining the input signal and the output signal of the closed loop control in accordance with second combinatory logic to generate a second control signal;

activating a first electrical energy source in accordance with the first control signal;

activating a second electrical energy source in accordance with the second control signal;

operating the closed loop control with electrical energy corresponding to a combination of energy supplied by the first and second electrical energy sources to generate the output signal; and wherein the first combinatory logic is an OR logic gate, and the second combinatory logic is an AND logic gate.

13. The method according to claim 12, wherein the first electrical energy source is a first current source and the second electrical energy source is a second current source.

14. The method according to claim 13, wherein:

the first combinatory logic generates the first control signal with a first logical level to activate the first current source and with a second logical level to deactivate the first current source;

the second combinatory logic generates the second control signal with a first logical level to activate the second current source and with a second logical level to deactivate the second current source; and the first and second combinatory logic and the first and second current sources are selected such that $I_1/I_2=n/m$ and $T_1/T_2=m/n$ with n, m being positive numbers and $I_1$ being current generated by the first current source, $I_2$ being current generated by the second current source, $T_1$ being a time interval during which the first combinatory logic generates the first control signal with the first logical level, and $T_2$ being a time period during which the second combinatory logic generates the second control signal with the first logical level.

15. The method according to claim 14, wherein the first combinatory logic is an OR logic gate, and the second combinatory logic is an AND logic gate, and n=1 and m=3 to generate the output signal with a phase shift of 90° with respect to the input signal.

16. The method according to claim 14, wherein the first combinatory logic is an OR logic gate, and the second combinatory logic is an AND logic gate, and n=1 and m=2 to generate the output signal with a phase offset of 60° with respect to the input signal.

17. A device for generating an output signal having a predetermined phase shift with respect to an input signal, the device comprising:

a closed loop control circuit for generating the output signal in dependence on the input signal;

a first decider for logically combining the input signal and the output signal of the closed loop control circuit in accordance with first combinatory logic to generate a first control signal;

a second decider for logically combining the input signal and the output signal of the closed loop control circuit in accordance with second combinatory logic to generate a second control signal;

a first electrical energy source activated in accordance with the first control signal;

a second electrical energy source activated in accordance with the second control signal;

wherein the closed loop control circuit is operated with electrical energy corresponding to a combination of the energy supplied by the first electrical energy source and the energy supplied by the second electrical energy source to generate the output signal;

wherein the first electrical energy source is a first current source and the second electrical energy source is a second current source;

the first decider generates the first control signal with a first logical level to activate the first current source and with a second logical level to deactivate the first current source;

the second decider generates the second control signal with a first logical level to activate the first current source and with a second logical level to deactivate the second current source; and the first and second current sources and the first and second deciders are selected such that $I_1/I_2=n/m$ and $T_1/T_2=m/n$ with n, m being positive numbers, and with $I_1$ being current supplied by the first current source, $I_2$ being current supplied by the second current source, $T_1$ being a time period during which the first decider generates the first control signal with the first logical level, and $T_2$ being a time period during which the second decider generates the second control signal with the first logical level.

18. The device according to claim 17, further comprising a capacitance controlling the operation of the closed loop control circuit, the capacitance being charged and discharged, respectively, by the electrical energy corresponding to the combination of the energy supplied by the first electrical energy source and the energy supplied by the second electrical energy source.

19. The device according to claim 18, wherein the capacitance is charged by the energy supplied by the first electrical energy source and discharged by the energy supplied by the second electrical energy source.

20. The device according to claim 17, wherein the closed loop control circuit is a delay locked loop circuit.

21. The device according to claim 17, wherein the closed loop control circuit is a phase locked loop circuit.

22. The device according to claim 17, wherein the device comprises a capacitance controlling the operation of the closed loop control circuit, the capacitance being charged using current supplied by the first current source and being discharged using current of the second current source.

23. The device according to claim 17, wherein a difference current between current supplied by the first current source and current supplied by the second current source is fed to the closed loop control circuit to operate the closed loop control circuit.

24. The device according to claim 17, wherein the first decider is an OR logic gate and the second decider is an AND logic gate, and n=1 and m=3 to obtain a phase offset of 90° of the output signal with respect to the input signal.

25. The device according to claim 17, wherein the first decider is an OR logic gate and the second decider is an AND logic gate, and n=1 and m=2 to obtain a phase offset of 60° of the output signal with respect to the input signal.

26. The device according to claim 17, wherein the first decider is an OR logic gate and the second decider is an AND logic gate.

27. The device according to claim 17, wherein the first and second electrical energy sources are variable to adjust the ratio between the energy supplied by the first electrical energy source and the ratio supplied by the second electrical energy source.

28. The device according to claim 17, wherein a delay circuit is provided for delaying an additional signal derived from the input signal by a predetermined delay time, an output signal of the delay circuit being supplied to at least one of the first decider or the second decider.

29. The device according to claim 17, wherein the closed loop control circuit outputs the output signal via a level adaptation circuit.

30. The device according to claim 29, wherein the level adaptation circuit comprises a combination of an inverter and a latch to output the output signal.

31. A device for generating an output signal having a predetermined phase shift with respect to an input signal, the device comprising:

a closed loop control circuit for generating the output signal in dependence on the input signal;

a first decider for logically combining the input signal and the output signal of the closed loop control circuit in accordance with first combinatory logic to generate a first control signal;

a second decider for logically combining the input signal and the output signal of the closed loop control circuit in accordance with second combinatory logic to generate a second control signal;

a first electrical energy source activated in accordance with the first control signal;

a second electrical energy source activated in accordance with the second control signal;

wherein the closed loop control circuit is operated with electrical energy corresponding to a combination of the energy supplied by the first electrical energy source and the energy supplied by the second electrical energy source to generate the output signal; and wherein the first decider is an OR logic gate and the second decider is an AND logic gate.

32. The device according to claim 31, wherein the first electrical energy source is a first current source and the second electrical energy source is a second current source.

33. The device according to claim 32, wherein:

the first decider generates the first control signal with a first logical level to activate the first current source and with a second logical level to deactivate the first current source;

the second decider generates the second control signal with a first logical level to activate the first current source and with a second logical level to deactivate the second current source; and the first and second current sources and the first and second deciders are selected such that $I_1/I_2=n/m$ and $T_1/T_2=m/n$ with n, m being positive numbers, and with $I_1$ being current supplied by the first current source. $I_2$ being current supplied by the second current source, $T_1$ being a time period during which the first decider generates the first control signal with the first logical level, and $T_2$ being a time period during which the second decider generates the second control signal with the first logical level.

34. The device according to claim 33, wherein the first decider is an OR logic gate and the second decider is an AND logic gate, and n=1 and m=3 to obtain a phase offset of 90° of the output signal with respect to the input signal.

35. The device according to claim 33, wherein the first decider is an OR logic gate and the second decider is an AND logic gate, and n=1 and m=2 to obtain a phase offset of 60° of the output signal with respect to the input signal.

36. A device for generating an output signal having a predetermined phase shift with respect to an input signal, the device comprising:
   a closed loop control circuit for generating the output signal in dependence on the input signal;
   a first decider for logically combining the input signal and the output signal of the closed loop control circuit in accordance with first combinatory logic to generate a first control signal;
   a second decider for logically combining the input signal and the output signal of the closed loop control circuit in accordance with second combinatory logic to generate a second control signal;
   a first electrical energy source activated in accordance with the first control signal;
   a second electrical energy source activated in accordance with the second control signal;
   wherein the closed loop control circuit is operated with electrical energy corresponding to a combination of the energy supplied by the first electrical energy source and the energy supplied by the second electrical energy source to generate the output signal;
   wherein the closed loop control circuit outputs the output signal via a level adaptation circuit; and
   wherein the level adaptation circuit comprises a combination of an inverter and a latch to output the output signal.

37. A device for generating an output signal having a predetermined phase shift with respect to an input signal, the device comprising:
   first combinatory logic to which the input signal and the output signal are supplied to generate a first control signal;
   second combinatory logic to which the input signal and the output signal are supplied to generate a second control signal;
   a first current source controlled by the first control signal;
   a second current source controlled by the second control signal, the first current source connected between a voltage supply and the second current source, the second current source connected between the first current source and ground;
   a control source connected to a node between the first and second current sources;
   a delay controlled by the control source;
   the first combinatory logic generates the first control signal with a first logical level to activate the first current source and with a second logical level to deactivate the first current source;
   the second combinatory logic generates the second control signal with a first logical level to activate the first current source and with a second logical level to deactivate the second current source; and
   the first and second current sources and the first and second combinatory logics are selected such that $I_1/I_2=n/m$ and $T_1/T_2=m/n$ with n, m being positive numbers, and with $I_1$ being current supplied by the first current source, $I_2$ being current supplied by the second current source, $T_1$ being a time period during which the first combinatory logic generates the first control signal with the first logical level, and $T_2$ being a time period during which the second combinatory logic generates the second control signal with the first logical level.

38. The device according to claim 37, wherein the control source comprises a capacitance, the capacitance charged by current supplied by one of the first and second current sources and discharged by current supplied by the other of the first and second current sources.

39. The device according to claim 37, further comprising a delay circuit that delays the input signal by a predetermined delay time, an output signal of the delay circuit being supplied to at least one of the first combinatory logic or the second combinatory logic in addition to the input signal and the output signal.

40. The device according to claim 37, wherein a level adaptation circuit is connected between the delay and an output of the device.

* * * * *

UNITED STATES PATENT AND TRADEMARK OFFICE
CERTIFICATE OF CORRECTION

| | | |
|---|---|---|
| PATENT NO. | : 7,242,228 B2 | Page 1 of 1 |
| APPLICATION NO. | : 11/227987 | |
| DATED | : July 10, 2007 | |
| INVENTOR(S) | : Josef Hölzle | |

It is certified that error appears in the above-identified patent and that said Letters Patent is hereby corrected as shown below:

<u>On the Title Page</u>

In column 1, item (75), delete "Wörishofen" and substitute --Worrishofen-- in its place.

<u>In the Claims</u>

Column 9, in claim 1, line 18 delete "$T_1T_2$" and substitute --$T_1/T_2$-- in its place.

Column 9, in claim 3, line 37 after "respectively" delete "If" and substitute --if-- in its place.

Column 9, in claim 4, line 41, immediately after "loop control" insert --,-- (comma)

Column 9, in claim 4, line 43, after "capacitance of the" delete "dosed" and substitute --closed-- in its place.

Column 10, in claim 10, line 2, after "input signal is" delete "ted" and substitute --fed-- in its place.

Column 12, in claim 33, line 59, after "by the first current" delete "source. $I_2$" and substitute --source, $I_2$-- in its place.

Signed and Sealed this

Thirtieth Day of October, 2007

JON W. DUDAS
*Director of the United States Patent and Trademark Office*